United States Patent [19]
Capodieci

[11] Patent Number: 6,044,007
[45] Date of Patent: Mar. 28, 2000

[54] MODIFICATION OF MASK LAYOUT DATA TO IMPROVE WRITEABILITY OF OPC

[75] Inventor: Luigi Capodieci, Sunnyvale, Calif.

[73] Assignee: Advanced Micro Devices, Inc., Sunnyvale, Calif.

[21] Appl. No.: 09/275,165

[22] Filed: Mar. 24, 1999

[51] Int. Cl.[7] .................................................. G11C 13/00
[52] U.S. Cl. .................. 365/120; 430/5; 430/30
[58] Field of Search ...................... 365/120, 122; 430/5, 30, 311, 312

[56] References Cited

U.S. PATENT DOCUMENTS

| | | | |
|---|---|---|---|
| 5,663,017 | 9/1997 | Schinella et al. | 430/5 |
| 5,723,233 | 3/1998 | Garza et al. | 430/5 |
| 5,740,068 | 4/1998 | Liebmann et al. | 364/489 |
| 5,821,014 | 10/1998 | Chen et al. | 430/5 |
| 5,827,623 | 10/1998 | Ishida et al. | 430/5 |
| 5,858,591 | 1/1999 | Lin et al. | 430/30 |
| 5,879,844 | 3/1999 | Yamamoto et al. | 430/30 |
| 5,998,070 | 12/1999 | Lee | 430/5 |

*Primary Examiner*—David Nelms
*Assistant Examiner*—Hien Nguyen
*Attorney, Agent, or Firm*—Amin, Eschweiler & Turocy, LLP

[57] ABSTRACT

A data storage medium contains mask layout data for use in writing a mask includes a first mask data portion which corresponds to a feature having an interior corner. The first mask data portion corresponding to the interior corner includes a multi-level or stepped inner serif in the interior corner which provides for improved writeability of OPC independent of process push or bias. Alternatively, the data storage medium contains mask layout data which includes a second mask data portion. The second mask data portion corresponds to a feature having an exterior corner and includes a multi-level or stepped outer serif on the exterior corner. The stepped outer serif also provides for improved writeability of OPC independent of process push or bias.

23 Claims, 4 Drawing Sheets

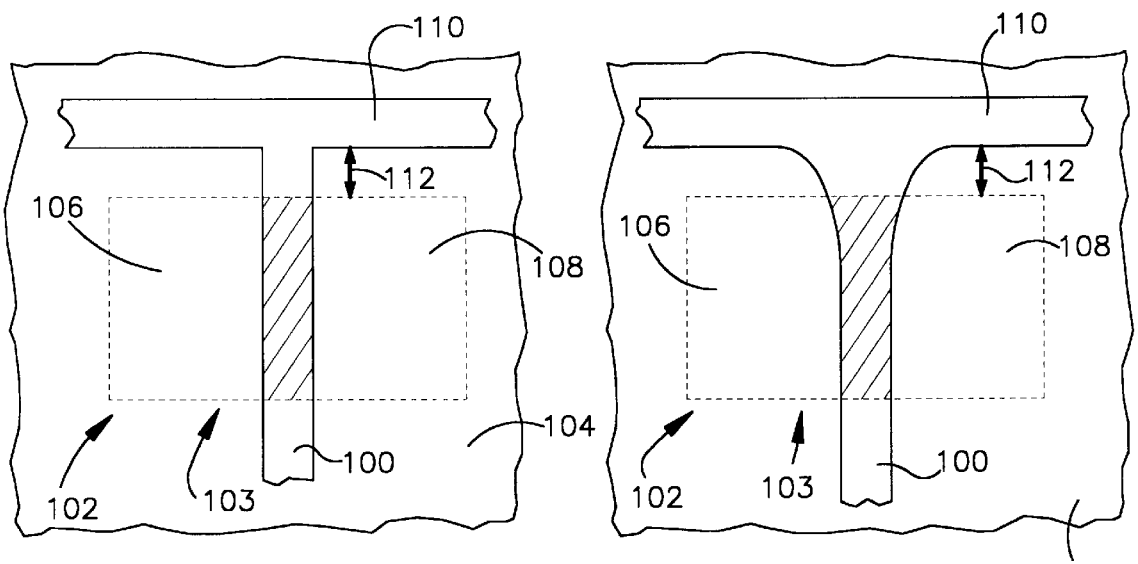
FIGURE 7a  FIGURE 7b
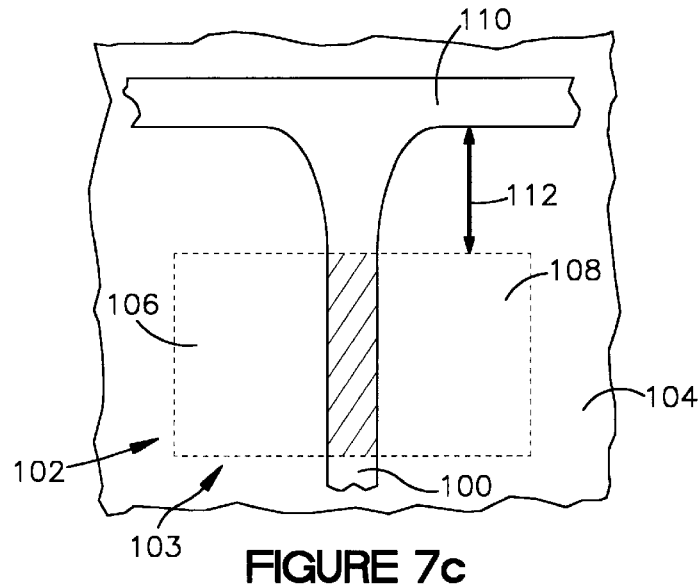
FIGURE 7c
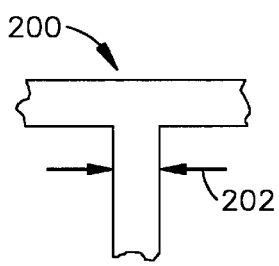  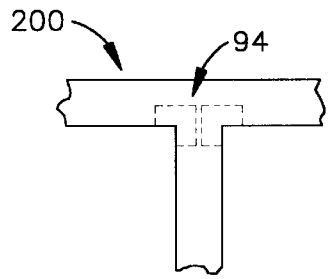  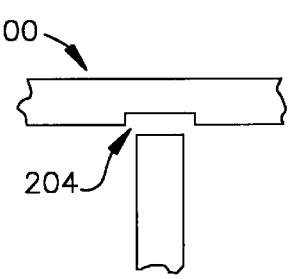
FIGURE 8a   FIGURE 8b   FIGURE 8c

MODIFICATION OF MASK LAYOUT DATA TO IMPROVE WRITEABILITY OF OPC

FIELD OF THE INVENTION

The present invention generally relates to semiconductor processing, and more particularly relates to a device and method for modifying the mask layout data used to generate masks to improve the performance of optical proximity correction techniques.

BACKGROUND OF THE INVENTION

The minimum feature sizes of integrated circuits are continuously decreasing in order to increase the packing density of the various semiconductor devices formed thereby. With this size reduction, however, various steps within the integrated circuit fabrication process become more difficult. One such area within the semiconductor fabricating process which experiences unique challenges as feature sizes shrink is photolithography.

Photolithography involves selectively exposing regions of a resist-coated silicon wafer to form a radiation pattern. Once exposure is complete, the exposed resist is developed in order to selectively expose and protect the various regions on the silicon wafer defined by the exposure pattern (e.g., silicon regions in the substrate, polysilicon on the substrate, or insulating layers such as silicon dioxide).

An integral component of a photolithography system is a reticle (often called a mask) which includes a pattern thereon corresponding to features to be formed in a layer on the substrate. A reticle typically includes a transparent glass plate covered with a patterned light blocking material such as chrome. The reticle is placed between a radiation source producing radiation of a pre-selected wavelength (e.g., ultraviolet light) and a focusing lens which may form part of a stepper apparatus. Placed beneath the stepper is a resist-covered silicon wafer. When the radiation from the radiation source is directed onto the reticle, light passes through the glass (in the regions not containing the chrome patterns) and projects onto the resist-covered silicon wafer. In this manner, an image of the reticle is transferred to the resist.

The resist (sometimes referred to as the "photoresist") is provided as a thin layer of radiation-sensitive material that is spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor.

An exemplary prior art reticle is illustrated in FIG. 1. Prior art FIG. 1 includes a reticle 10 corresponding to a desired integrated circuit pattern 12. For simplicity, the pattern 12 consists of only two design features. A clear reticle glass 14 allows radiation to project onto a resist covered silicon wafer. The chrome regions 16 and 18 on the reticle 10 block radiation to generate an image on the wafer corresponding to the desired integrated circuit design features.

As light passes through the reticle 10, it is diffracted and scattered by the edges of the chrome 16 and 18. This causes the projected image to exhibit some rounding and other optical distortion. While such effects pose relatively little difficulty in layouts with large features (e.g., features with critical dimensions greater than one micron), they can not be ignored in present day layouts where critical dimensions are about 0.25 micron or smaller. The problem highlighted above becomes more pronounced in integrated circuit designs having feature sizes below the wavelength of the radiation used in the photolithographic process.

Prior art FIG. 2 illustrates the impact of the diffraction and scattering caused by the radiation passing through the reticle 10 and onto a section of a silicon substrate 20. As illustrated, the illumination pattern on the substrate 20 contains an illuminated region 22 and two dark regions 24 and 26 corresponding to the chrome regions 16 and 18 on the reticle 10. The illuminated pattern 22 exhibits considerable distortion, with the dark regions 24 and 26 having their corners 28 rounded. Unfortunately, any distorted illumination pattern propagates through the developed resist pattern and negatively impacts the integrated circuit features such as polysilicon gate regions, vias in dielectrics, etc. As a result, the integrated circuit performance is degraded.

To remedy this problem, a reticle correction technique known as optical proximity correction (OPC) has been developed. OPC involves the adding of dark regions to and/or the subtracting of dark regions from portions of a reticle to overcome the distorting effects of diffraction and scattering. Typically, OPC is performed on a digital representation of a desired integrated circuit pattern. This digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Prior art FIG. 3 illustrates how OPC may be employed to modify the reticle design illustrated in FIG. 1 and thereby provide more accurately the desired illumination pattern. As shown, an OPC-corrected reticle 30 includes two features 32 and 34 outlined in chrome on the glass plate 36. Various corrections 38 have been added to the base features. Some correction takes the form of "serifs." Serifs are small, appendage-type addition or subtraction regions typically made at corner regions on reticle designs. Although the term serif is sometimes used as a generic term to identify both addition and subtraction regions, in order to provide clarity, the term "inner serif" in the present specification will only refer to subtraction type regions while addition type regions will be referred to separately as "outer serifs." Therefore in prior art FIG. 3, the inner serif 40 is a square, subtractive region in an interior corner 42 of the feature 32 while the square chrome extensions protruding beyond the corners are the outer serifs 44.

Prior art FIG. 4 illustrates an illumination pattern 50 produced on a wafer surface 52 by radiation passing through the reticle 30 of prior art FIG. 3. As shown, the illuminated region includes a light region 54 surrounding a set of dark regions 56 and 58 which substantially faithfully represent the desired pattern illustrated in prior art FIG. 1. Note that the illumination pattern 22 of prior art FIG. 2 which was not produced with a reticle having OPC (reticle 10) has been improved greatly by the reticle 30 having OPC.

It is an object of the present invention to further improve upon the prior art OPC techniques presently being employed.

SUMMARY OF THE INVENTION

The present invention relates to a data storage medium containing modified mask layout data and a related method which improves the writeability of optical proximity correction data to a mask. The modified mask layout data includes data portions at either interior corners and/or exterior corners of features. For interior corners, the data portions include a stepped inner serif in the interior corners which provide for increased radiation illumination in the corner of the mask feature despite any process push or bias. The increased illumination in the corner allows underlying photoresist on the mask to dissolve and thus allows the desired OPC data to be transferred effectively to the mask. Similarly, for exterior corners, the data portions includes a stepped outer serif on the exterior corners which provide for increased radiation illumination in the corner for dark field type masks despite any process push or bias. The present invention thus provides for a substantial improvement in the writeability of OPC to masks.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7a is a fragmentary plan view of a design layout showing ideal feature geometries;

FIG. 7b is a fragmentary plan view of a design layout showing the negative impact of feature rounding on device performance;

FIG. 7c is a fragmentary plan view of a design layout showing how one solution to address feature rounding undesirably results in an inefficient use of space;

FIGS. 8a–8c are fragmentary plan views of a T-shaped feature, wherein enlarged serifs employed for optical proximity correction result in a feature discontinuity;

DETAILED DESCRIPTION OF THE INVENTION

Figure 1:
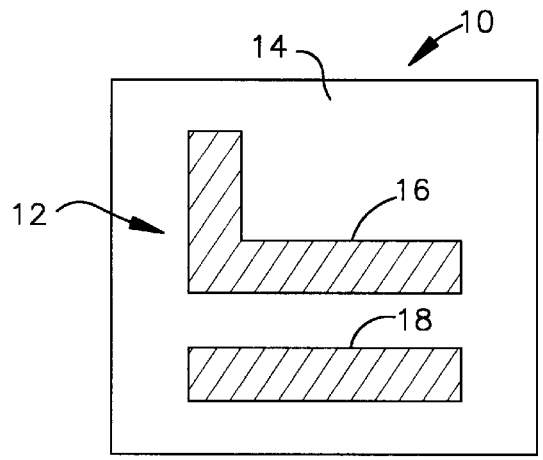
FIG. 1 is a plan view illustrating prior art mask layout data for various features.

The following is a detailed description of the present invention made in conjunction with the attached Figures, wherein like reference numerals will refer to like elements throughout. It has been discovered by the inventor of the present invention that a technique presently used to massage the mask layout data prior to "writing" the mask negatively impacts the integrity of OPC data corrections. The present invention provides a modification to traditional OPC data corrections within the mask layout data which results in a substantial improvement in reticle fabrication.

Figure 5:
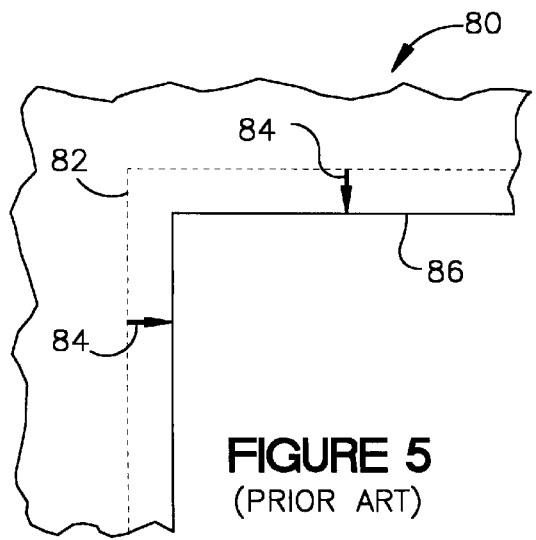
FIG. 5 is a fragmentary plan view of mask layout data and modified mask layout data representing the process push or bias.

In generating reticles, reticle manufacturers massage or alter the mask layout data to take into account the etch process (e.g., the etch chemistry, photoresist, etc.) which is used to pattern the chrome and thus define the features on the reticle. The alteration of the mask layout data to take into account the etch process is called the mask process "push" or "bias". For example, in 4X type reticles, a typical process push may be anywhere between about 80–150 nm. Such a process push is illustrated in FIG. 5, which shows a fragmentary portion of the mask layout data 80. Although the actual feature desired on the reticle is illustrated by a dotted line 82 and represents the mask layout data supplied to the reticle manufacturer, the mask layout data is modified or "pushed" in the direction of the arrows 84 to provide modified mask layout data 86, as illustrated by the solid line. Subsequently, after etching the chrome, the resultant feature on the reticle approximates the feature represented by the dotted line 82.

Figure 2:
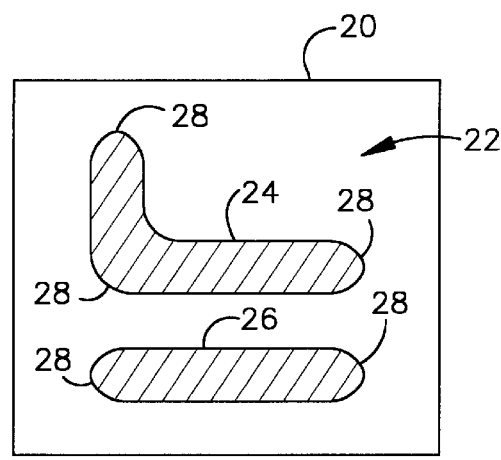
FIG. 2 is a plan view illustrating feature rounding on a substrate manufactured with a reticle having the mask layout data of FIG. 1.
Figure 3:
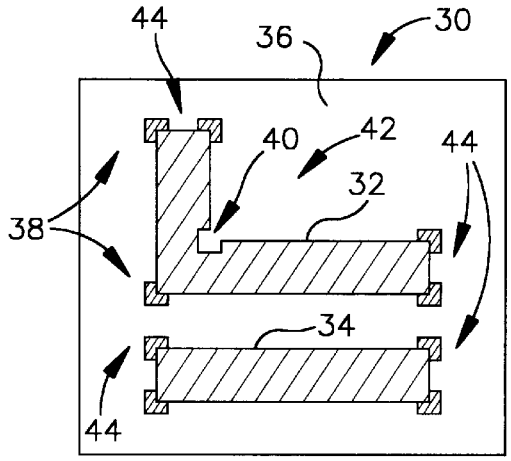
FIG. 3 is a plan view illustrating prior art mask layout data for various features employing conventional optical proximity correction.
Figure 4:
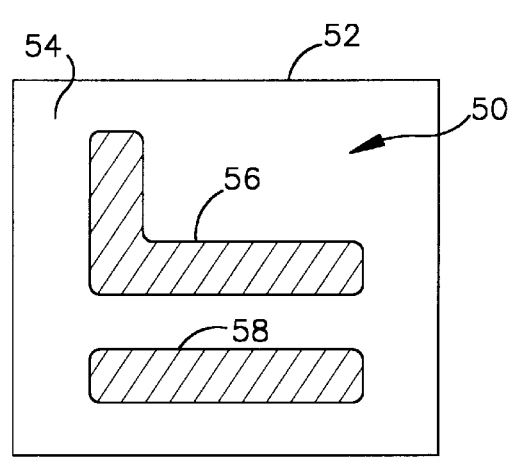
FIG. 4 is a plan view illustrating reduced feature rounding on a substrate manufactured with a reticle having the mask layout data of FIG. 3.
Figure 6:
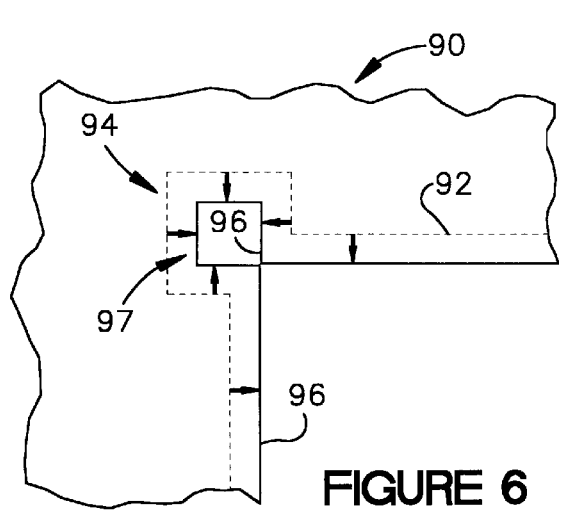
FIG. 6 is a fragmentary plan view of mask layout data employing conventional optical proximity correction and modified mask layout data representing the process push.

Although the process push illustrated in FIG. 5 appears rather harmless, it has been discovered in the present invention that such a process push negatively impacts conventional OPC correction data, as illustrated in FIG. 6. In FIG. 6, the original mask layout data 90 is illustrated with a dotted line 92 and includes an OPC serif 94 at the interior corner of the feature. In this example, the serif is 400 nm×400 nm and the process push employed by the reticle manufacturer is 100 nm. Upon modifying the original mask layout data 90 to incorporate the process push, the modified mask layout data appears as shown by the solid line 96. As can be seen in the modified data 96, the serif 94 has been "pushed" by the process push and is now a small square 97 that appears as a separate feature. In addition, the serif has been made significantly smaller and, in some cases, will be unable to be resolved in the subsequent exposure and etch process, thus effectively eliminating the serif 94 and its impact in providing the desired OPC. The resulting feature on the reticle will thus not have a substantially right-angle interior corner, but rather will be substantially rounded as illustrated in feature 24 of prior art FIG. 2.

As stated above, conventional OPC techniques do not substantially reduce feature rounding due to the process push. Such rounding is highly undesirable and results in either degraded transistor performance, increased transistor layout spacing (which decreases device packing density), or both. For example, as illustrated in FIG. 7a, a polysilicon gate 100 for a transistor 102 overlies an active region 103 in a semiconductor substrate 104. The gate 100 overlies a channel (not shown) and defines a source 106 and a drain 108 in the active region 103. The gate 100 receives control signals through a gate line 110 and the intersection between the gate 100 and the gate line 110 often forms a T-shaped feature as illustrated.

Ideally, the T-shaped feature employs right angles as illustrated in FIG. 7a. With right angled features, a distance 112 between the active region 103 and the gate line 110 can be minimized, thus increasing the device packing density without impacting the transistor performance. Unfortunately, however, as illustrated in FIG. 7b, features do not have right angles, but instead exhibit rounding and, in fact, significant rounding when OPC is not employed or is substantially mitigated by the process push as discussed supra. In FIG. 7b, the spacing 112 between the active area 103 and the gate line 110 is maintained as in FIG. 7a to maintain the desired device packing density. Note, however, that the hatched area of the gate 100 which overlies the active region 103 is substantially larger than in FIG. 7a due to the rounding of the corners. Thus the transistor of FIG. 7b is slower than the transistor of FIG. 7a. Not only does such rounding negatively impact device performance, but it adds a level of nonuniformity between transistors which is undesirable.

In FIG. 7c, the spacing 112 between the active region 103 and the gate line 110 is substantially increased in order to minimize the impact of the corner rounding. Although the transistor device performance is not degraded substantially compared to the device of FIG. 7b, the packing density of the device is significantly reduced due to the wasted space between the active area 103 and the gate line 110. Therefore there is a strong need for a modification to the conventional OPC correction data to further reduce corner rounding.

One solution to such a problem is to make the serif 94 in the original mask layout larger so that the OPC data remains after the process push. This solution, however, is unsatisfactory, especially as features sizes continue to shrink, for the following reason. As illustrated in FIGS. 8a–8c, many features are not single rectangles, for example, a polysilicon gate connection is often formed as a T-shaped feature 200. As a gate width 202 (corresponding to a transistor channel length) decreases, the size of the serifs 94 (illustrated as dotted lines in FIG. 8b) become larger with respect to the feature size. The result of such a phenomena is that the serifs 94 overlap one another, which causes a discontinuity in the mask layout data. Such a discontinuity further results in a feature discontinuity 204, as illustrated in FIG. 8c. Such a discontinuity 204 is highly undesirable, since it results (in a best case) in a highly resistive gate or (in a worst case) an inoperative transistor.

The present invention relates to a modification of conventional OPC mask layout data which provides effective OPC despite mask process push or bias, thus resulting in a substantial improvement in the writeability of OPC to masks. The present invention is directed toward mask layout data that is sent to the mask shop or manufacturer. The mask layout data is preferably stored on a recording medium such as a magnetic recording medium (e.g., a disk or tape) or an optical recording medium (e.g., a CD-ROM), however, other types of recording medium may be used and are contemplated as falling within the scope of the present invention. For example, the data may be sent to the mask manufacturer via modem or over the Internet in an encrypted form and downloaded onto a storage medium local to the mask manufacturer. The mask layout data is then read by the mask manufacturer and massaged using the process push or bias to take into account the particular etch process that will be employed in making the mask.

Figure 9:
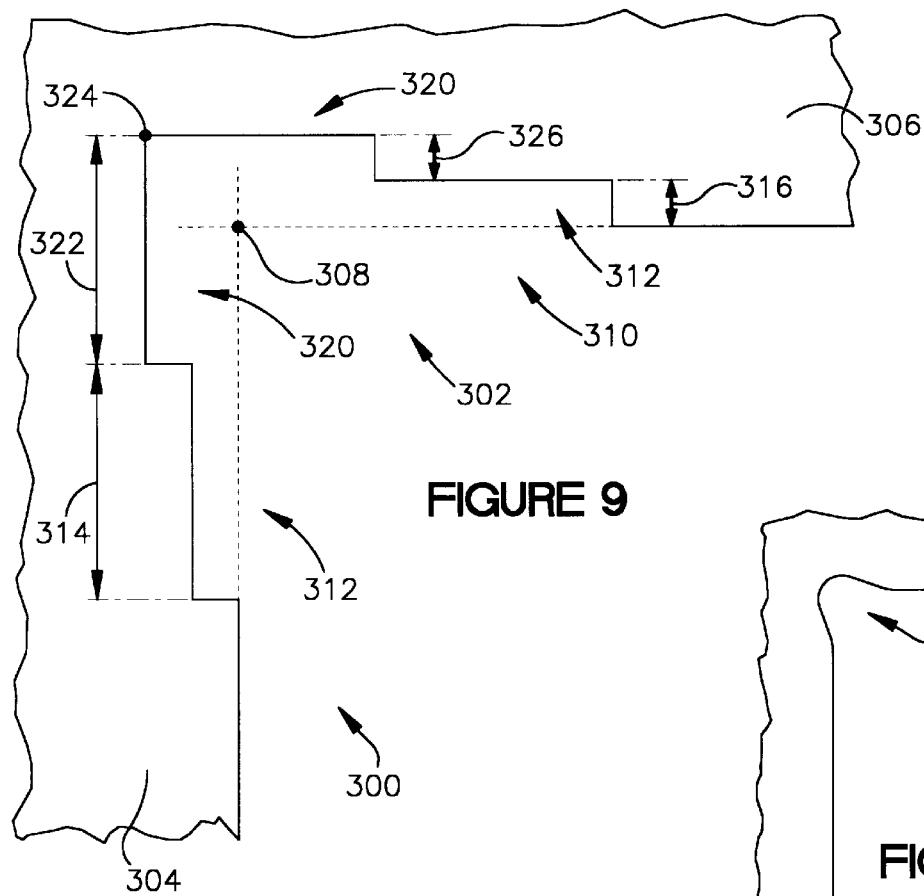
FIG. 9 is a fragmentary plan view of modified OPC mask layout data according to the present invention.

One exemplary embodiment of the mask layout data of the present invention is illustrated in FIG. 9. FIG. 9 illustrates a fragmentary plan view of mask layout data which represents a generally L-shaped feature 300 having an interior corner 302. The L-shaped feature 300 has a first portion 304 and a second portion 306 which extend toward a feature vertex 308 to ultimately form a substantially right angle. According to the present invention, an L-shaped portion of a feature represents any shape feature having an interior corner. For example, a T-shaped feature has two L-shaped portions corresponding to the interior corners.

A stepped inner serif 310 is located generally in the interior corner of the feature 300. The stepped inner serif 310 includes a first inner serif 312 which has a first length 314 which extends along each portion of the feature 300 toward the vertex 308. In addition, the first inner serif 312 has a first width 316 which extends into each portion 304 and 306 of the feature 300.

The stepped inner serif 310 further includes a second inner serif 320 which is positioned to be an inner serif with respect to the first inner serif 312. In other words, the second inner serif 320 is positioned with respect to the first inner serif 312 in a manner similar to the positioning of the first inner serif 312 with respect to the feature 300. Thus the second inner serif 320 may be considered as "nested" within the first inner serif 312. The second inner serif 312 has a second length 322 on each portion 304 and 306 which extends from the first length 314 toward the feature vertex 308. The second lengths 322 extend beyond the feature vertex 308 on each portion 304 and 306 and meet within the feature 300 at a stepped inner serif vertex 324. In addition, the second inner serif 320 includes a second width 326 which extends into each portion 304 and 306 of the feature 300, respectively.

According to a preferred embodiment of the present invention, the stepped inner serif 310 has dimensions which are a function of the process push or bias which will be used in modifying the mask layout data. For example, the first length 314 and the second length 322 have lengths which are preferably about 1.0–1.3 times the process push. Therefore if the process push is 100 nm, the length of the first length 314 and the second length 322 would each be about 100–130 nm. Preferably, the first length 314 and the second length 322 are the same length. Alternatively, however, each length may differ from each other; furthermore, the lengths 314 and 322 may vary beyond the above preferred range. Likewise, the dimensions of the first width 316 and the second width 326 are preferably a function of the process push. For example, the first width 316 and the second width 326 have lengths which are preferably about 0.2–0.25 times the process push. Therefore if the process push is about 100 nm, the dimension of the first width 316 and the second width 326 would each be about 20–25 nm. Preferably, the first width 316 and the second width 326 are the same dimension. Alternatively, however, each width may differ from the other; furthermore, the widths 316 and 326 may vary beyond the above preferred range.

Figure 10:
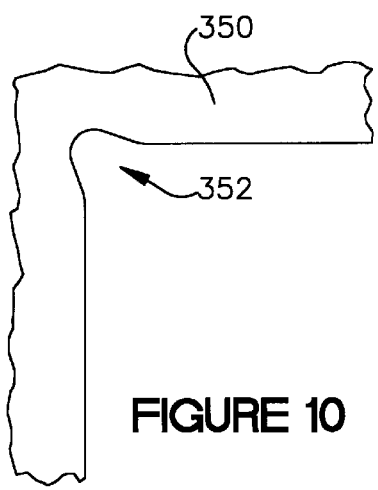
FIG. 10 is a fragmentary plan view of a mask generated using the modified OPC mask layout data of FIG. 9 according to the present invention.

The mask layout data modifications of the present invention provide for a stepped inner serif which begins at a position further away from the feature vertex 308 than conventional OPC techniques. Consequently, even after the mask process push occurs, a larger amount of light can get into the interior corner 302 near the feature vertex 308 in order to desolve the photoresist therein and thus allow for the removal of chrome in the corner 302. A significant amount of testing has been performed using the stepped inner serif 310 of the present invention which confirms the above discussion. An exemplary L-shaped feature 350 formed on a mask using the stepped inner serif 310 mask layout data of FIG. 9 of the present invention is illustrated in FIG. 10. Note that in an interior corner 352 of the feature, the corner provides an OPC serif. Consequently, when the mask is subject to radiation exposure, light will expose the photoresist in the interior corner region 352 and thus lead to a feature on the semiconductor substrate that closely approximates an ideal right angle type feature geometry.

The present invention, as described above in conjunction with FIGS. 9 and 10 illustrate a stepped inner serif 310 using a clear-field type mask. That is, a substantial amount of the mask is transparent with the chrome regions defining features to be formed on the semiconductor type substrate. The present invention, however, is also applicable to dark-field type masks. Dark-field type masks are the opposite or inverse of clear-field type masks and are used, for example, in the formation of metal interconnects such as vias as well as other features. In a dark-field type mask the majority of the mask is covered with chrome and the portions relating to desired features are etched. In order to form low resistance type contacts, for example, it is undesirable for the vias to be substantially rounded as will occur in the prior art. Instead, to maximize the cross sectional area of the via, substantially right angled type features are desirable. Therefore the modified OPC mask layout of the present invention may be employed as stepped outer serifs as illustrated in FIG. 11.

Figure 11:
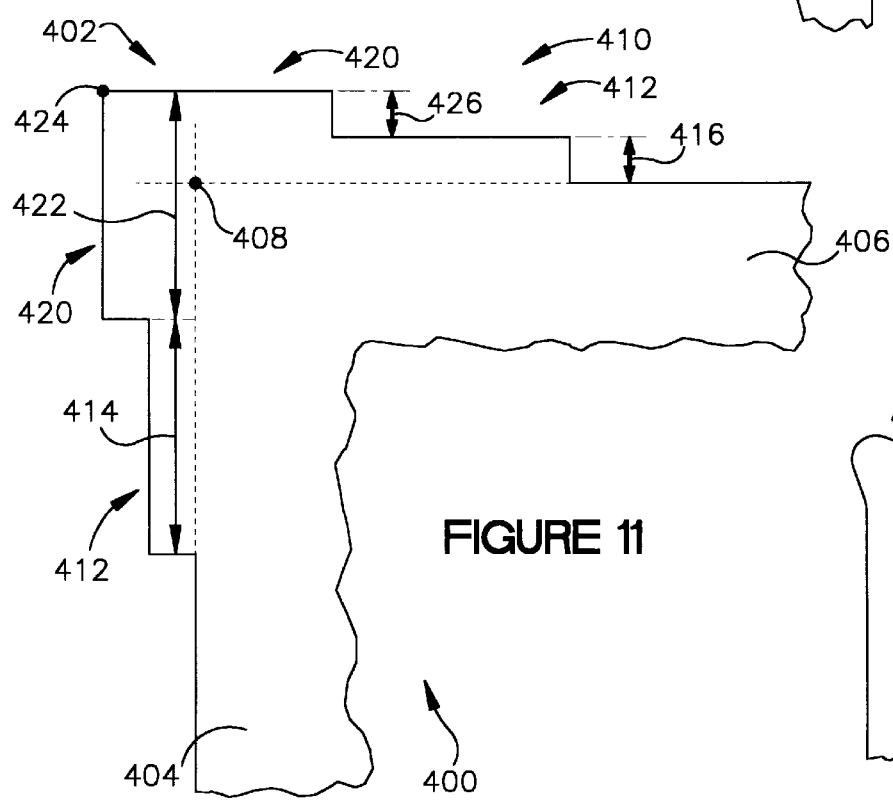
FIG. 11 is a fragmentary plan view of modified OPC mask layout data according to another aspect of the present invention.

FIG. 11 illustrates a fragmentary plan view of mask layout data which represents a generally L-shaped feature 400 having an exterior corner 402. The L-shaped feature 400 has a first portion 404 and a second portion 406 which extend toward a feature vertex 408 to ultimately form a substantially right angle. According to the present invention, an L-shaped portion of a feature represents any shape feature having an exterior corner. For example, a rectangular feature has four L-shaped portions corresponding to the exterior corners.

A stepped outer serif 410 is located generally in the exterior corner of the feature 400. The stepped outer serif 410 includes a first outer serif 412 which has a first length 414 which extends along each portion of the feature 400 toward the vertex 408. In addition, the first outer serif 412 has a first width 416 which extends into each portion 404 and 406 of the feature 400.

The stepped outer serif 410 further includes a second outer serif 420 which is positioned to be an outer serif with respect to the first outer serif 412. In other words, the second outer serif 420 is positioned with respect to the first outer serif 412 in a manner similar to the positioning of the first outer serif 412 with respect to the feature 400. Thus the second outer serif 420 may be considered as coupled onto the first outer serif 412. The second outer serif 412 has a second length 422 on each portion 404 and 406 which extends from the first length 414 toward the feature vertex 408. The second lengths 422 extend beyond the feature vertex 408 on each portion 404 and 406 and meet within the feature 400 at a stepped outer serif vertex 424. In addition, the second outer serif 420 includes a second width 426 which extends into each portion 404 and 406 of the feature 400, respectively.

According to a preferred embodiment of the present invention, the stepped outer serif 410 in a dark-field mask has dimensions which are a function of the process push or bias which will be used in modifying the mask layout data. For example, the first length 414 and the second length 422 have lengths which are preferably about 0.5–0.65 times the process push. Therefore if the process push is 100 nm, the length of the first length 414 and the second length 422 would each be about 50–65 nm. Preferably, the first length 414 and the second length 422 are the same length. Alternatively, however, each length may differ from each other; furthermore, the lengths 414 and 422 may vary beyond the above preferred range. Likewise, the dimensions of the first width 416 and the second width 426 are preferably a function of the process push. For example, the first width 416 and the second width 426 have lengths which are preferably about 0.1–0.125 times the process push. Therefore if the process push is about 100 nm, the dimension of the first width 416 and the second width 426 would each be about 10–12.5 nm. Preferably, the first width 416 and the second width 426 are the same dimension. Alternatively, however, each width may differ from the other; furthermore, the widths 416 and 426 may vary beyond the above preferred range. Note that in the above preferred dimensions, the stepped serif dimensions for a dark-field mask differ from the clear-field mask because the process push utilized in dak-field masks is typically larger than the process push used on clear-field masks. Such dimensions, however, may alternatively be the same and such dimensions are contemplated as falling within the scope of the present invention.

Figure 12:
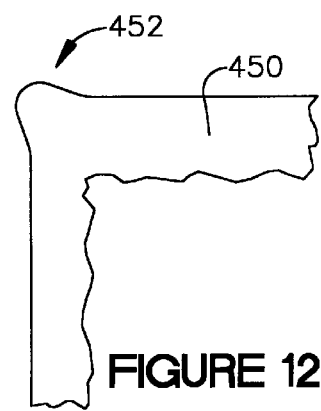
FIG. 12 is a fragmentary plan view of a mask generated using the modified OPC mask layout data of FIG. 11 according to another aspect of the present invention.

The mask layout data modifications of the present invention provide for a stepped outer serif which begins at a position further away from the feature vertex 408 than conventional OPC techniques. Consequently, even after the mask process push occurs, a larger amount of light can get into the exterior corner 402 near the feature vertex 408 in order to desolve the photoresist therein and thus allow for the removal of chrome in the exterior corner 402. A significant amount of testing has been performed using the stepped outer serif 410 of the present invention which confirms the above discussion. An exemplary L-shaped feature 450 formed on a mask using the stepped outer serif 410 mask layout data of FIG. 11 of the present invention is illustrated in FIG. 12. Note that in an exterior corner 452 of the feature, the corner provides an OPC outer serif. Consequently, when the mask is subject to radiation exposure, light will expose the photoresist in the exterior corner region 452 and thus lead to a feature on the semiconductor substrate that closely approximates an ideal right angle type feature geometry.

According to the exemplary embodiments of the present invention discussed supra, a stepped inner serif has been disclosed in conjunction with a clear-field type mask and a stepped outer serif has been disclosed in conjunction with a dark-field type mask. The present invention, however, also contemplates the use of a stepped outer serif in clear-field masks and a stepped inner serif in dark-field masks. Experimental results have verified that in such cases the stepped inner and outer serifs provided improved feature resolution. In such cases, the preferred dimensions of the stepped serifs are similar to that discussed above. That is, a stepped outer serif in a clear-field mask preferably has length dimensions of about 1.0–1.3 times the process push and width dimensions of about 0.20–0.25 times the process push while a stepped inner serif in a dark-field mask preferably has length dimensions of about 0.5–0.65 times the process push and width dimensions of about 0.1–0.125 times the process push, respectively.

Figure 13:
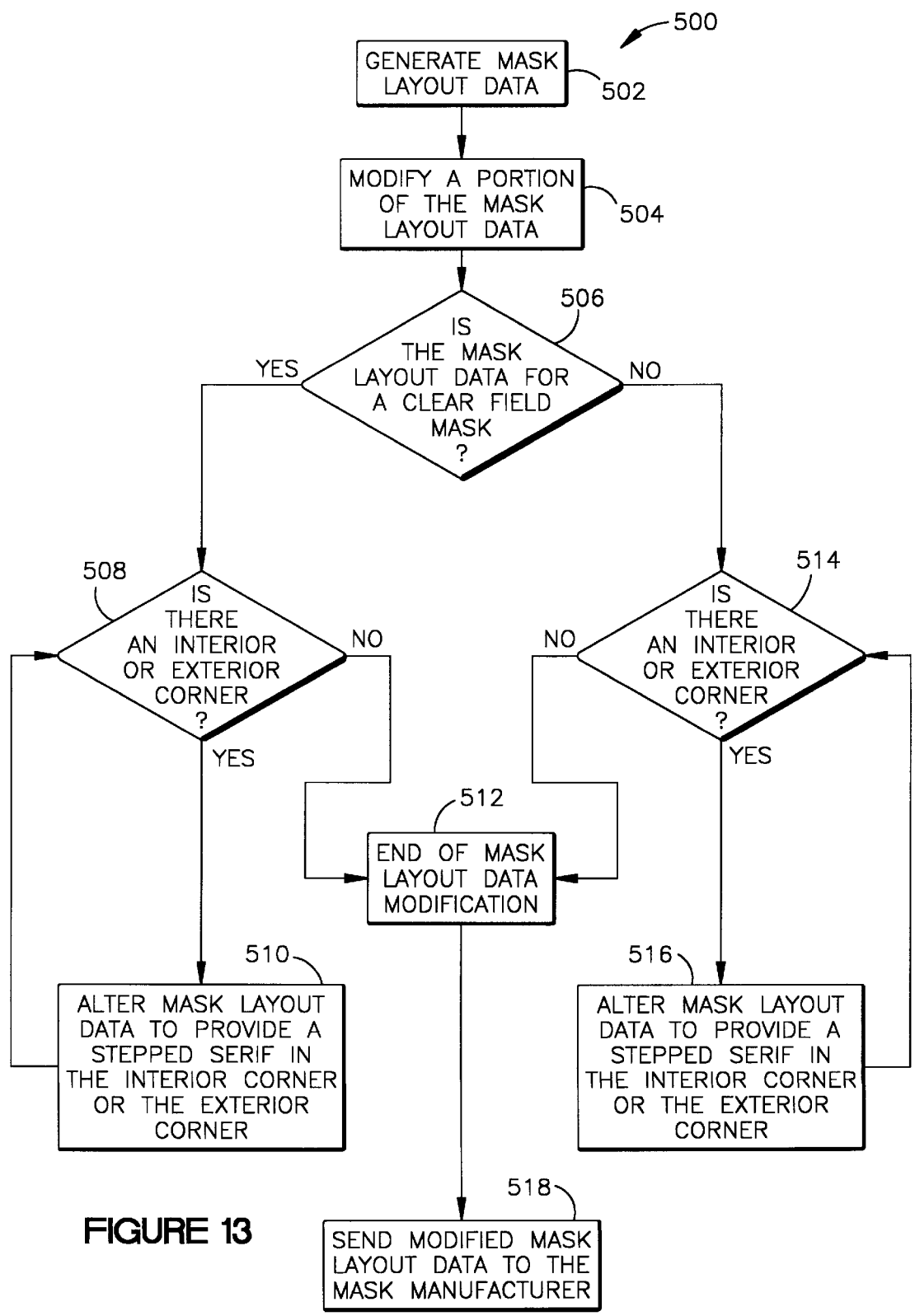
FIG. 13 is a flow chart illustrating a method of modifying mask layout data according to the present invention.

The present invention may alternatively be appreciated as a method of improving the writeability of OPC onto a mask. Such a method is illustrated in FIG. 13 and designated by reference numeral 500, and will be described in conjunction therewith. The method 500 beings at step 502 in which mask layout data is generated in accordance with a desired set of features to be formed on the mask. Although the Figures illustrated in conjunction with the present invention have illustrated only one or more features for the sake of simplicity, it should be understood that the present invention applies to mask layout data associated with tens, hundreds, thousands or even millions of features on the mask.

Once the mask layout data is generated at step 502, one or more portions of the mask layout data are modified at step 504 in order to improve the writeability of OPC to the mask. The step 504 includes a determination at step 506 whether the mask layout data corresponds to a clear-field mask. If the answer is in the affirmative (YES), another inquiry is made to determine whether any of the features have an interior or exterior corner at step 508. If the answer is in the affirmative (YES), then the method 500 proceeds to step 510 and the mask layout data associated with the identified interior or exterior corner is altered to reflect a stepped inner or outer serif, such as the stepped serifs 310 and 410 illustrated in FIGS. 9 and 11 of the present invention. The method 500 then continues steps 508 and 510 until a determination is made at step 508 that all the mask layout data associated with interior and exterior corners have been identified and appropriately modified (NO), at which point the layout modification process is finished (step 512).

If, however, at step 506 it is determined that the mask layout data is not associated with a clear-field mask (NO), then the mask layout data is associated with a dark-field mask and the method 50 proceeds to step 514 and an inquiry is made whether the mask layout data includes any interior or exterior corners. If the answer is in the affirmative (YES), then the mask layout data associated with an identified interior or external corner is modified at step 516 to reflect a stepped inner or outer serif, such as the stepped serifs 310 and 410 illustrated in FIGS. 9 and 11 of the present invention. Steps 514 and 516 are then repeated until it is determined at step 514 that all the interior or external corners in the mask layout data have been modified (NO). The method 500 then proceeds to step 512, at which point the modified mask layout data may be sent to the mask shop or manufacturer at step 518.

Although the method 500 of the present invention preferably addresses every interior corner or every exterior corner based on whether the mask layout data corresponds to a clear-field mask or a dark-field mask, the method 500 may alternatively vary only particular interior or exterior corners. For example, some corners may not require OPC for various reasons or other features may be large enough so that conventional OPC techniques may suffice. Therefore the present invention contemplates a discriminating process based on various criteria for selectively modifying the interior or exterior corners.

Although the present invention is shown and described with respect to a stepped inner serif and a stepped outer serif consisting of two serifs, respectively, additional serifs may be further nested or coupled thereon to increase the number of stepped regions in the mask layout data. In addition, although the stepped inner serif and the stepped outer serif were discussed in preferred terms as a function of the process push, the lengths and widths of the stepped inner and outer serifs may vary and such variations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A data storage medium containing mask layout data including optical proximity correction for writing desired mask feature data onto a mask, comprising:

a first data portion corresponding to an interior corner of a substantially L-shaped portion of a feature having a first length and a second length which intersect at a vertex of a substantially right angle to form the interior corner, wherein the first data portion includes a stepped inner serif at the vertex of the interior corner for providing optical proximity correction, wherein the stepped inner serif includes a first inner serif having a first length extending from the vertex of the interior corner along each length of the L-shaped portion, and a first width which extends into each length of the L-shaped portion, the stepped inner serif further including a second inner serif having a second length extending from the first inner serif toward the vertex and into the L-shaped portion and along each length of the L-shaped portion, and having a second width which extends into each length of the first inner serif; or a second data portion corresponding to an exterior corner of a substantially L-shaped portion of a feature having a first length and a second length which intersect at substantially a right angle to form the exterior corner, wherein the second data portion includes a stepped outer serif at the vertex of the exterior corner for providing optical proximity correction, wherein the stepped outer serif includes a first outer serif having a first length extending from the vertex of the exterior corner along each length of the L-shaped portion, and a first width which extends out from each length of the L-shaped portion, the stepped outer serif further including a second outer serif having a second length extending from the first outer serif toward the vertex and out from the L-shaped portion and along each length of the L-shaped portion, and having a second width which extends out from each length of the first outer serif, wherein the stepped inner serif and the stepped outer serif maintain optical proximity correction data despite mask data push utilized in writing the mask layout data to form the mask feature, thereby providing an L-shaped portion of the feature in a mask having a substantially right angle interior corner or exterior corner.

2. The data storage medium of claim 1, wherein the first length of the first inner serif is a function of a mask layout data push utilized in writing the mask layout data.

3. The data storage medium of claim 2, wherein the first length is about 2.0 to about 2.6 times the mask layout data push.

4. The data storage medium of claim 1, wherein the second length of the second inner serif is a function of a mask layout data push utilized in writing the mask layout data.

5. The data storage medium of claim 4, wherein the second length is about 1.0 to about 1.3 times the mask layout data push.

6. The data storage medium of claim 1, wherein the first width of the first inner serif and the second width of the second inner serif are a function of a mask layout data push.

7. The data storage medium of claim 6, wherein the first width and the second width are about 0.2 to about 0.25 times the mask layout data push.

8. The data storage medium of claim 1, further including a third inner serif configured and positioned with respect to the second inner serif in a same manner as the second inner serif is configured and positioned with respect to the first inner serif.

9. The data storage medium of claim 1, wherein the first length of the first outer serif is a function of a mask layout data push utilized in writing the mask layout data.

10. The data storage medium of claim 9, wherein the first length is about 1.0 to about 1.3 times the mask layout data push.

11. The data storage medium of claim 1, wherein the second length of the second outer serif is a function of a mask layout data push utilized in writing the mask layout data.

12. The data storage medium of claim 11, wherein the second length is about 0.5 to about 0.65 times the mask layout data push.

13. The data storage medium of claim 1, wherein the first width of the first outer serif and the second width of the second outer serif are a function of a mask layout data push.

14. The data storage medium of claim 6, wherein the first width and the second width are about 0.1 to about 0.125 times the mask layout data push.

15. The data storage medium of claim 1, further including a third outer serif configured and positioned with respect to the second outer serif in a same manner as the second outer serif is configured and positioned with respect to the first outer serif.

16. The data storage medium of claim 1, wherein the data storage medium comprises one of a magnetic storage device or an optical storage device.

17. The data storage medium of claim 1, wherein the first data portion corresponds to clear-field type mask layout data.

18. The data storage medium of claim 1, wherein the second data portion corresponds to dark-field type mask layout data.

19. A data storage medium containing mask layout data including optical proximity correction for use in writing a mask, comprising:
   a first mask layout data portion corresponding to a feature having an interior corner, wherein the first mask layout data portion includes a stepped inner serif in the interior corner; or
   a second mask layout data portion corresponding to a feature having an exterior corner, wherein the second mask layout data portion includes a stepped outer serif on the exterior corner.

20. The data storage medium of claim 19, wherein the stepped inner serif comprises:
   a first inner serif, and
   a second inner serif nested within the first inner serif, thereby providing a multi-tiered structure in the interior corner of the first mask layout data portion.

21. The data storage medium of claim 19, wherein the stepped outer serif comprises:
   a first outer serif; and
   a second outer serif extending from the first outer serif, thereby providing a multi-tiered structure on the exterior corner of the second mask layout data portion.

22. A method of improving the writeability of optical proximity correction onto a mask, comprising the steps of:
   generating mask layout data in accordance with one or more desired features to be written onto the mask;
   modifying a portion of the mask layout data corresponding to at least one of the features having an interior corner or an exterior corner, respectively, wherein the act of modifying the mask layout data further includes:
   altering the portion of the mask layout data to reflect a stepped inner serif at the interior corner or a stepped outer serif at the exterior corner, respectively.

23. The method of claim 22, wherein the stepped inner serif or the stepped outer serif has a size which is a function of a process push.

* * * * *

UNITED STATES PATENT AND TRADEMARK OFFICE
CERTIFICATE OF CORRECTION

PATENT NO.: 6,044,007

DATED: March 28, 2000

INVENTOR(S): Luigi Capodieci

It is certified that error appears in the above-identified patent and that said Letters Patent is hereby corrected as shown below:

Column 6, line 26, please replace the numeral "312" with the numeral --320--.

Column 7, line 53, please replace the numeral "412" with the numeral --420--.

Column 8, line 21, please replace the word "dak-field" with --dark-field--.

Column 9, line 28, please replace the numeral "50" with --500--.

line 32, please replace the word "external" with --exterior--.

line 36, please replace the word "external" with --exterior--.

Signed and Sealed this

Twenty-seventh Day of February, 2001

NICHOLAS P. GODICI

*Attest:*

*Attesting Officer*    *Acting Director of the United States Patent and Trademark Office*